United States Patent
Huijsing et al.

(10) Patent No.: US 6,559,720 B1
(45) Date of Patent: May 6, 2003

(54) GM-CONTROLLED CURRENT-ISOLATED INDIRECT-FEEDBACK INSTRUMENTATION AMPLIFIER

(75) Inventors: Johan Hendrik Huijsing, Schipluiden (NL); Behzad Shahi, San Jose, CA (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 0 days.

(21) Appl. No.: 10/014,124

(22) Filed: Oct. 26, 2001

(51) Int. Cl.[7] .................................................. H03F 3/45
(52) U.S. Cl. ....................... 330/253; 330/258; 330/259; 330/292
(58) Field of Search ................................ 330/253, 258, 330/292, 259, 260, 261

(56) References Cited

U.S. PATENT DOCUMENTS

| | | | | |
|---|---|---|---|---|
| 3,434,069 A | * | 3/1969 | Jones | 330/30 |
| 3,868,583 A | * | 2/1975 | Krabbe | 330/30 |
| 5,936,466 A | * | 8/1999 | Andoh et al. | 330/253 |
| 6,356,153 B1 | * | 3/2002 | Ivanov et al. | 330/253 |
| 6,359,510 B1 | * | 3/2002 | Ishii et al. | 330/253 |

OTHER PUBLICATIONS

Wassenaar, Roelof Foppe, "Analysis of Analog C–MOS Circuits", 1996, pp. 138–140.

* cited by examiner

Primary Examiner—Henry Choe
(74) Attorney, Agent, or Firm—Blakely, Sokoloff, Taylor & Zafman LLP

(57) ABSTRACT

Constant GM models and GM-controlled current-isolated indirect-feedback instrumentation amplifiers. The constant GM models provide a transconductance that is proportional to the inverse of a resistance in the constant GM model circuits over a wide range of common mode and differential mode inputs. Current-isolated indirect-feedback instrumentation amplifiers using constant GM models to track the common mode and differential inputs of, and provide the tail currents for, the differential input pair in the transconductance amplifiers greatly enhance the instrumentation amplifier performance in numerous ways.

8 Claims, 6 Drawing Sheets

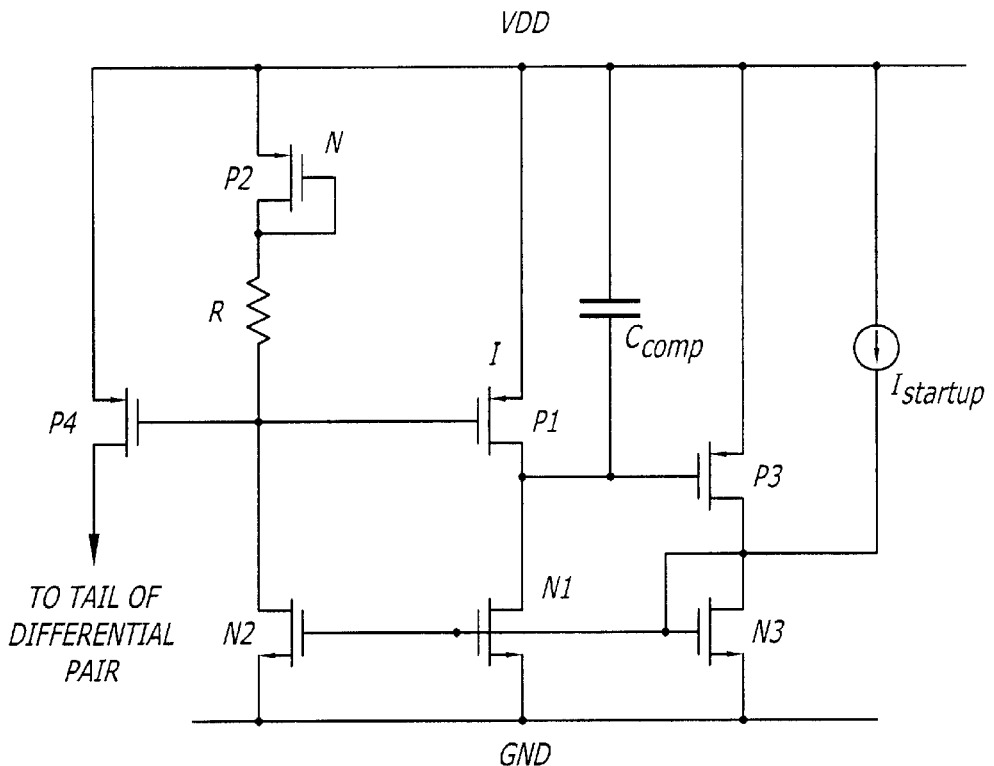
FIG. 6 *(Prior Art)*
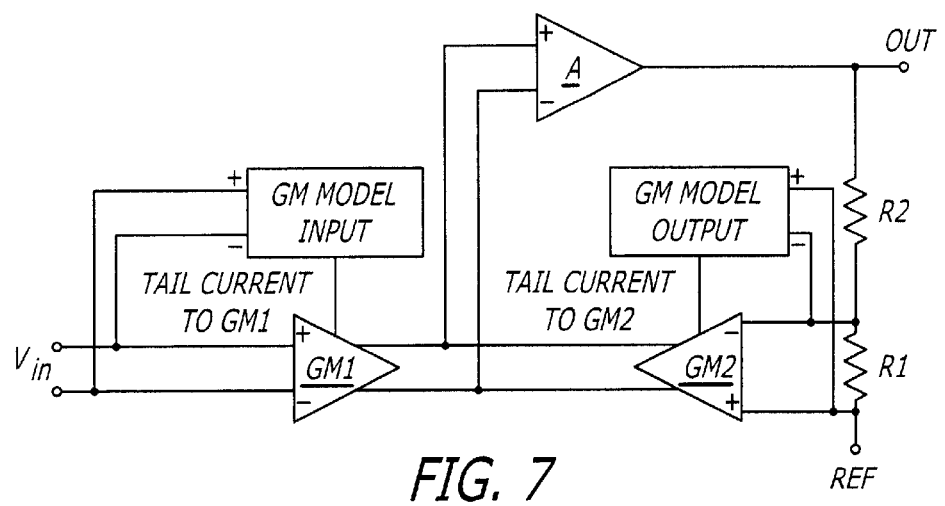
FIG. 7

FIG. 8
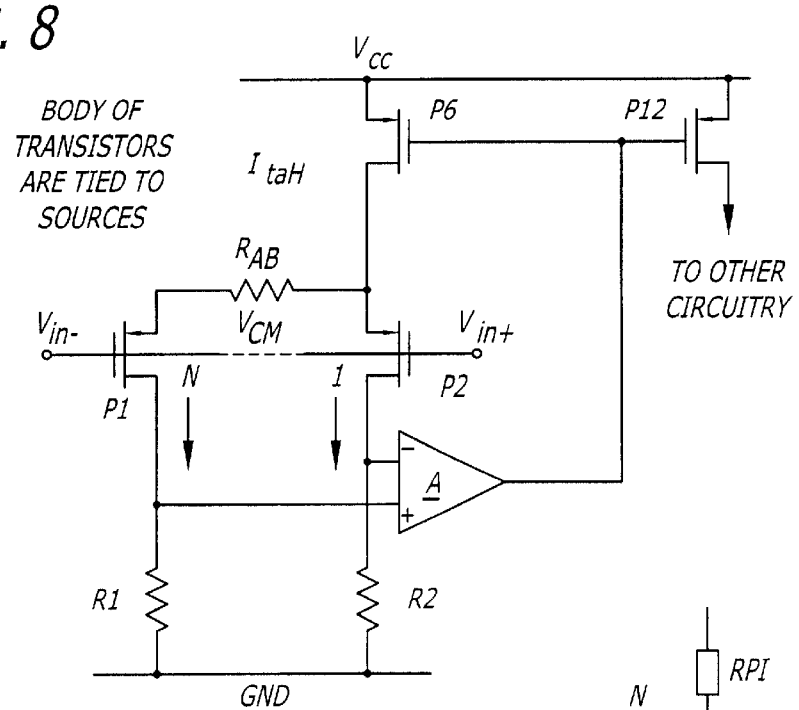
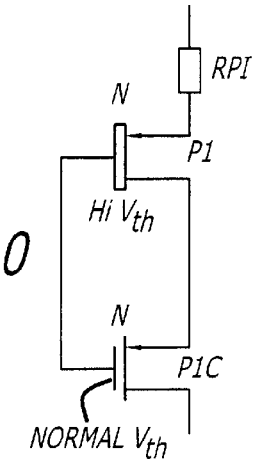
FIG. 10
FIG. 12
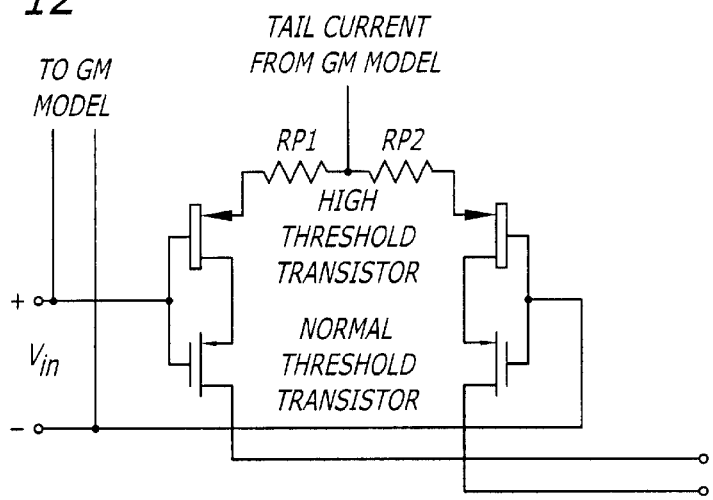

GM-CONTROLLED CURRENT-ISOLATED INDIRECT-FEEDBACK INSTRUMENTATION AMPLIFIER

BACKGROUND OF THE INVENTION

1. Field of the Invention

The present invention relates to the field of current-isolated indirect-feedback instrumentation amplifiers.

2. Prior Art

Instrumentation amplifiers are considered closed loop gain blocks with high gain accuracy and excellent common mode rejection ratio (CMRR) performance. Non-sampled instrumentation amplifiers suitable for precision analog integrated circuits on silicon chips can be divided into two main categories.

1. Bridge type instrumentation amplifiers, and
2. Current isolation instrumentation amplifiers.

The bridge type instrumentation amplifier is the most widely used instrumentation amplifier, which is built around an opamp (operational amplifier) and four resistors in a bridge configuration. A typical bridge type instrumentation amplifier stage is shown in FIG. 1a. As shown in FIG. 1b, two non-inverting buffers with a few resistors often precede this stage for increased input impedance and gain variability using an external resistor. Nevertheless, the gain accuracy and common mode rejection ratio of such circuits are still very much dependant on the bridge section, sometimes called the difference amplifier.

Although bridge type instrumentation amplifiers are known for excellent linearity and gain accuracy, they often suffer from the degraded common mode rejection ratio at lower gains, besides the difficulty with lower rail sensing (depending on the opamp characteristics). For example, in FIG. 1b the output of opamps of A1 and A2 cannot reach the GND, thereby prohibiting the rail sensing of the instrumentation amplifier. They also require large integrated circuit area (for incorporating accurate opamps) which makes them unsuitable for packaging in small commercial packages, such as an SOT23 package.

The common mode rejection ratio of bridge type instrumentation amplifiers is characterized by the following equation:

$$1/CMRR = 1/CMRR_{opamp} + 4\epsilon/(1+G)$$

Were:

$CMRR_{opamp}$ is the CMRR of the operational buffer used to build the difference amplifier $\epsilon$ is the resistor mismatch of the bridge G is the open loop gain of the amplifier From the above, it is quite evident that even with a perfect common mode rejection ratio for the opamp, the mismatch of the bridge, especially at lower gains, can degrade the overall common mode rejection ratio to poor values unfit for most applications. For example, with a 0.04% mismatch, the overall common mode rejection ratio can only reach 62 dB of rejection.

The second class of instrumentation amplifiers is based on the conversion of the input differential voltage to a current through a transconductance amplifier, and then the conversion of the current back to an output voltage in order to isolate the input stage and its common mode voltage from the rest of the circuitry (see FIG. 2).

Indirect current feedback instrumentation amplifiers, as shown in FIG. 3, are based on the conversion of the input differential voltage $V_{IN}$ and a portion ($V_{FB}$) of the output voltage $V_{OUT}$ (the voltage across resistor R1 in the series combination of resistors R1 and R2), to two differential currents by transconductance amplifiers GM1 and GM2. These currents are then subtracted from each other and fed to a high gain transimpedance amplifier A at the output to close the loop.

A more detailed circuit for such an instrumentation amplifier is shown in FIG. 4. Here, differential amplifiers GM1 and GM2 are comprised of transistors P1 and P2 and resistors R11 and R12, and transistors P3 and P4 and resistors R21 and R22, respectively, together with current sources I.

Differential transconductance amplifier GM1 at the input and differential transconductance amplifier GM2 at the output, together with the transimpedance loop amplifier A (for differential current to voltage conversion) comprise the indirect current feedback architecture.

For such a configuration, assuming a high gain for the loop amplifier A, the output currents of the two transconductance blocks algebraically sum to zero. Thus the gain equation is:

$$\text{Gain} = (GM1/GM2)(1+R2/R1)$$

One limitation of such an arrangement, which is somewhat inherent to the very fundamental operation of the differential pairs with relatively large signals at their inputs, is the change of transconductance GM as a function of the common mode of the differential inputs. In that regard, note in FIG. 4 that the positive input of GM2 is referenced to ground, or alternatively referenced to a reference voltage, while each of the differential inputs $V_{IN}$ of GM1 is user controlled.

The transconductance of a differential pair can be defined as:

$$GM = \partial I_{od}/\partial V_{id} = f(V_{id}, V_{icm}, V_{bd}, V_{bcm})$$

Where:

$I_{od}$ = differential output current of the differential pair $V_{id}$ = input differential voltage $V_{icm}$ = input common mode voltage $V_{bd}$ = differential body voltage $V_{bcm}$ = common mode body voltage (see FIGS. 5a and 5b)

The change in GM due to $V_{icm}$ is caused by the dependency of GM on $V_{ds}$ for a MOS transistor. For large common mode swings, the nonlinearity in GM can be high, which in turn can be translated into a gain error, especially when intrinsic gains of the input devices are low, as in the case of a MOS differential pair. (The intrinsic gain is the product of GM and $r_o$, where $r_o$ is the output resistance of the transistor which is equal to the Early voltage ($V_A$) divided by the drain current $I_D$ ($r_o = V_A/I_D$). In FIG. 4, the differences in GM of the two differential pairs due to differences in the input common mode voltages of the two differential pairs will be such that the non-linearity of one pair is no longer canceled out by the non-linearity of the other pair. This gives rise to excessive non-linearity error.

Another limitation of the circuit in FIG. 4 is its low common mode rejection ratio CMRR, especially for MOS input devices. It can be shown that for any differential stage, the overall CMRR can be approximated as:

$$1/CMRR = (1/\mu)(\Delta\mu/\mu) + (1/CMRR \text{ associated with the tail current source, here ignored})$$

Where:
- $1/\mu = 1/((GM)(r_o)) = 1/$(average intrinsic gain of the input transistors), called the isolation factor
- $\Delta\mu/\mu =$ normalized difference between the intrinsic gains of input transistors, called the balancing factor For bipolar devices having an isolation factor on the order of $1/\mu = 1/1000$ and a balancing factor of $\Delta\mu/\mu = 2/100$, a common mode rejection ratio of 94 dB is achievable. However, in MOS devices of $1/\mu = 1/50$ and $\Delta\mu/\mu = 5/100$, the common mode rejection ratio is 60 dB, or less if the isolation or balancing factors tend to have even more degraded values.

On the other hand, MOS devices at the input of instrumentation amplifiers have the benefit of very high input impedance, in addition to providing the luxury of controlling the GM of the input stage by yet another parameter (W/L of the MOS devices) in addition to the input tail current. Using such a MOS differential pair for GM1 and GM2 in FIG. 4 results in lower overall common mode rejection ratio, and indirectly lower again accuracies through secondary effects of the input common mode voltage on GM.

Also known in the prior art is the constant GM bias circuit (FIG. 6) and the observation made by Roel Wassenaar. Roel Wassenaar made the observation that any differential pair with its transistors of the same length (L), same current density (I/W), where W is the width, and same type (bipolar or MOS of similar type) as the transistors in the bias circuit itself, and with the tail current of the differential pair fed from the bias circuit, will have the same GM as the bias circuitry itself.

Writing the translinear loop of $V_{GS_{P1}}$, $V_{GS_{P2}}$ and R:

$$I = K_1 \frac{1}{R^2} \text{ strong inversion}$$

$$I = K_2 \frac{1}{R} \text{ weak inversion}$$

Where K1 and K2 are process, size (W/L) and fold (N) dependant. Since GM is proportional to $\sqrt{I}$ in strong inversion and proportional to I itself in weak inversion, then:

$$GM \cong K_3 \frac{1}{R} \text{ strong inversion or}$$

$$GM \cong K_4 \frac{1}{R} \text{ weak inversion}$$

If transistor P4 is supplying the tail current of a differential pair with transistors of the same type, same length and same current density as transistors in the bias circuitry itself, then the GM of the differential pair is similar to the GM of the bias circuit.

BRIEF SUMMARY OF THE INVENTION

The GM-controlled current-isolated indirect-feedback instrumentation amplifiers of the present invention use two transconductance models to set the I/V characteristic of the two GM blocks in such instrumentation amplifiers. Any mismatch between the two transconductance blocks will be seen as a gain accuracy error. Moreover, since the common mode input voltage can change the transconductances, any mismatch between the transconductances GM1 and GM2 will no longer cancel each other as they change through common mode changes (non-linearity error). Also, for large differential signal swings, the I/V transfer function transconductance blocks tends to flatten, which will cause some non-linearity error due to GM reduction inherent to the differential pairs.

By adding two differential GM models, the transconductors of those two blocks (GM1 and GM2) will match the transconductance of their respective models. The models have the same transconductances equal to some reciprocal of a resistor over the input voltage range, process and temperature. Therefore the two GM models will have equivalent transconductances which will track over the input voltage range (common mode and differential mode), process and temperature.

The benefits of using this new technique include:
1. An increase in gain accuracy through better matching of GM1 and GM2, which are proportional to $1/R_{AB}$ and track over temperature, process and voltage.
2. Better gain linearity of the GM blocks as the tail currents of GM1 and GM2 are regulated with the differential input voltage. Also, the GM circuits are now regulated independent of their common mode voltage.
3. An increase in the common mode rejection ratio due to the regulation of the tail currents of the GM circuits.

BRIEF DESCRIPTION OF THE DRAWINGS

FIG. 6 is a circuit diagram for a prior art constant GM bias circuit.

FIG. 7 is a block diagram illustrating a GM-controlled current-isolated indirect-feedback instrumentation amplifier in accordance with the present invention.

FIG. 8 is a circuit diagram for a single constant GM circuit used in the present invention.

FIG. 10 illustrates the cascading used in the preferred embodiment of the present invention.

FIG. 12 is a circuit diagram for a preferred GM block for each of the input and output GM pairs (GM1 and GM2 of FIG. 7) (see also FIG. 4 for reference).

DETAILED DESCRIPTION OF THE PREFERRED EMBODIMENT

The present invention provides current-isolated instrumentation amplifiers using MOS transistors at their inputs having a linear large signal transconductance proportional to the inverse of a resistor which remains constant over the input differential and common mode voltage range, process and temperature, and with increased common mode rejection ratios. This current-isolation technique uses transconductance models to set the current/voltage transfer function of the GM blocks of the indirect current feedback instrumentation amplifier to a conductance in this GM model. This new instrumentation amplifier has the great advantage of having an accurate specification, yet manufacturable in small packages, as there is no need for super accurate operational amplifiers with the tremendous degree of analog trim normally associated with such configurations. The GM model block is called a constant transconductance model or constant GM model, for short.

FIG. 7 is a block diagram illustrating a GM-controlled current-isolated indirect-feedback instrumentation amplifier in accordance with the present invention. The diagram of FIG. 7 has input and output GM blocks each comprising differential pairs of MOS devices configured so that the tail currents of the differential pairs are provided by two identical transconductance blocks, called input and output GM models. The two transconductance blocks GM1 and GM2 each accurately track the transconductance of their respective models. Tracking of GM1 and GM2 with their models minimizes the gain accuracy error over the input differential and common mode voltage range, as well as the operating temperature range, provided their GM setting resistors as well as their degeneration resistors sufficiently track over temperature.

Figure 1A:
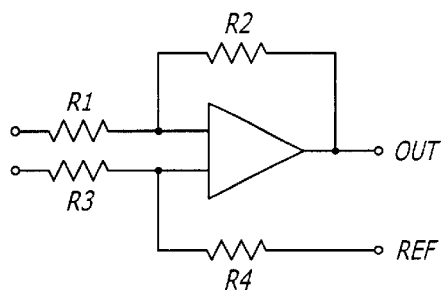
FIG. 1a is a diagram of a typical prior art bridge type instrumentation amplifier.
Figure 1B:
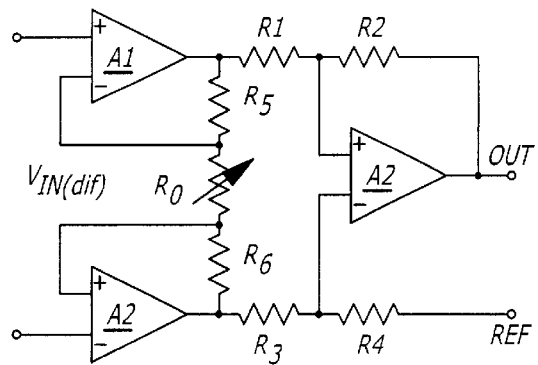
FIG. 1b is a diagram of a typical prior art bridge type instrumentation amplifier further including two non-inverting buffers and associated circuitry for increased input impedance and gain variability using an external resistor.
Figure 2:
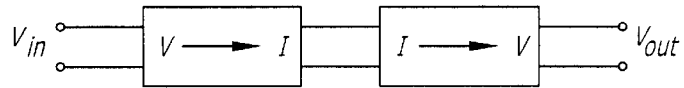
FIG. 2 illustrates another class of instrumentation amplifiers based on the conversion of the input differential voltage to a current through a transconductance amplifier, and then the conversion of the current back to an output voltage in order to isolate the input stage and its common mode voltage from the rest of the circuitry.
Figure 3:
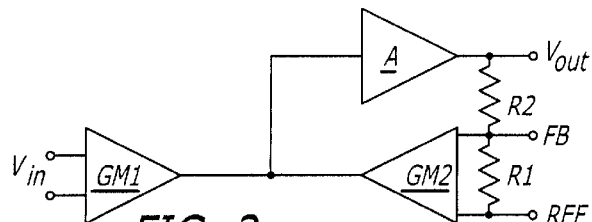
FIG. 3 illustrates the basic concept of prior art indirect current feedback instrumentation amplifiers.
Figure 4:
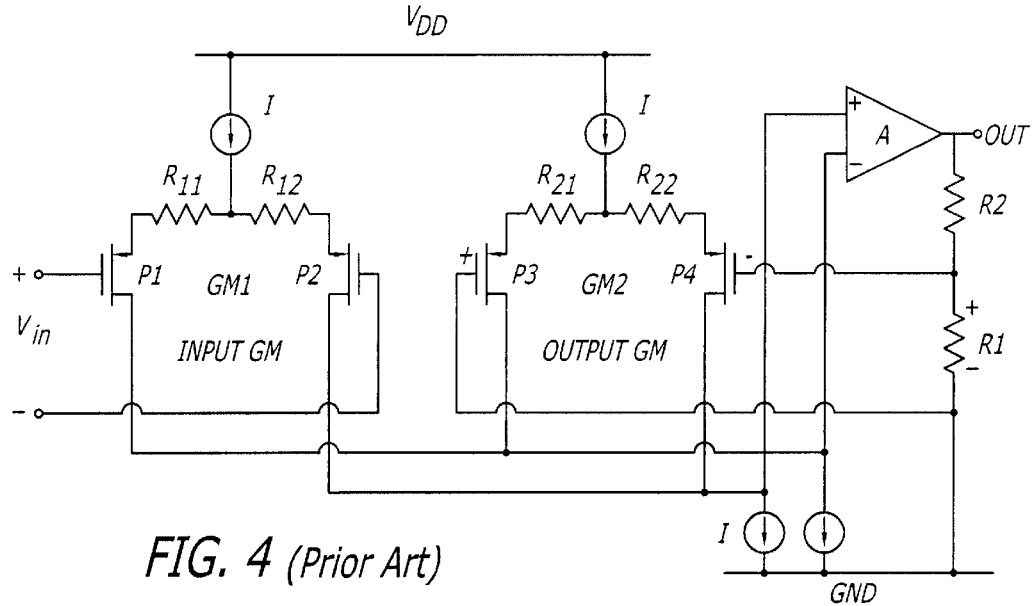
FIG. 4 is a more detailed circuit for prior art indirect current feedback instrumentation amplifiers.

These transconductance models (GM blocks) will sense the input differential voltage $V_{IN}$ and the attenuated output voltage ($V_{OUT}$) to output two identical tail currents that, unlike the circuit in FIG. 4, are now compensated for their input common mode and differential voltage changes such that their GM remains constant. This will remove the gain accuracy error associated with the architecture of FIG. 4, and improves linearity through the increased currents in the tails of GM1 and GM2 with higher differential input voltages.

Moreover, the GM models have their large signal transconductances proportional to a fixed conductance in these blocks. If the main GM blocks (GM1 and GM2) and the main bias circuit have similar architecture as the GM models (bias is a single constant GM circuit) and their transistors have the same current densities, type and length, with the same degeneration resistor configurations, then the transconductances of GM1 and GM2 themselves would also be proportional to this fixed conductance in the GM models.

In addition, in order to better remove the sensitivity to common mode in general, cascoding of high and low threshold transistors is performed for all the input transistors of GM1, GM2, GM INPUT MODEL, GM OUTPUT MODEL and the bias circuitries. This will improve the CMRR of the circuit even further.

FIG. 8 shows a single constant GM model. This circuit will always have a constant GM over common mode, and differential mode input voltage changes, particularly differential mode input voltage changes of one polarity. In particular, by writing the translinear equation of the loop containing the gate-source voltage Vgs of transistors P1 and P2 and resistor $R_{AB}$, it can be shown that:

Ip1=Ip2=k1/$(R_{AB})^2$ for a MOS in strong inversion, and

Ip1=Ip2=k2/$R_{AB}$ for a MOS in weak inversion.

Where:

k1 and k2 are functions of process, N, and the transistor sizes.

Since GM is inherently a function of the square root of the current for a MOS device in the strong inversion and saturation region, and a direct function of current in the weak inversion, GM will be a function of the conductance $1/R_{AB}$ in either case. This will cancel out the dependency of GM on the differential voltage in the GM relationship stated earlier. It can be shown that $$GM = \frac{2\left(1 - \frac{1}{\sqrt{N}}\right)}{R_{AB}}$$

for strong inversion or $$\frac{\ln(N)}{R_{AB}}$$

for weak inversion.

Also, as the common mode of the input is changing, the GM of the differential pair tends to change, partly due to finite output resistances and partly due to a change in the small signal transconductance of transistors. By connecting the gate of the tail transistor P6 in a feedback loop containing the loop amplifier A, the current through P6 is regulated in such a way that to keep the GM constant. This will get rid of the dependency of the GM on the input common mode voltage in the GM relationship.

By connecting the bodies of MOS transistors to their sources, the dependency on the body source voltage is also removed, making the constant GM only a function of the constants k1 (or k2) and the resistance of resistor $R_{AB}$ itself. An additional transistor P12 may be used to mirror the current through transistor P6 to provide tail current to another differential pair operating at the same common mode voltage in other circuitry to operate that differential pair at a constant transconductance (small signal only) irrespective of changes in the common mode voltage.

Figure 9:
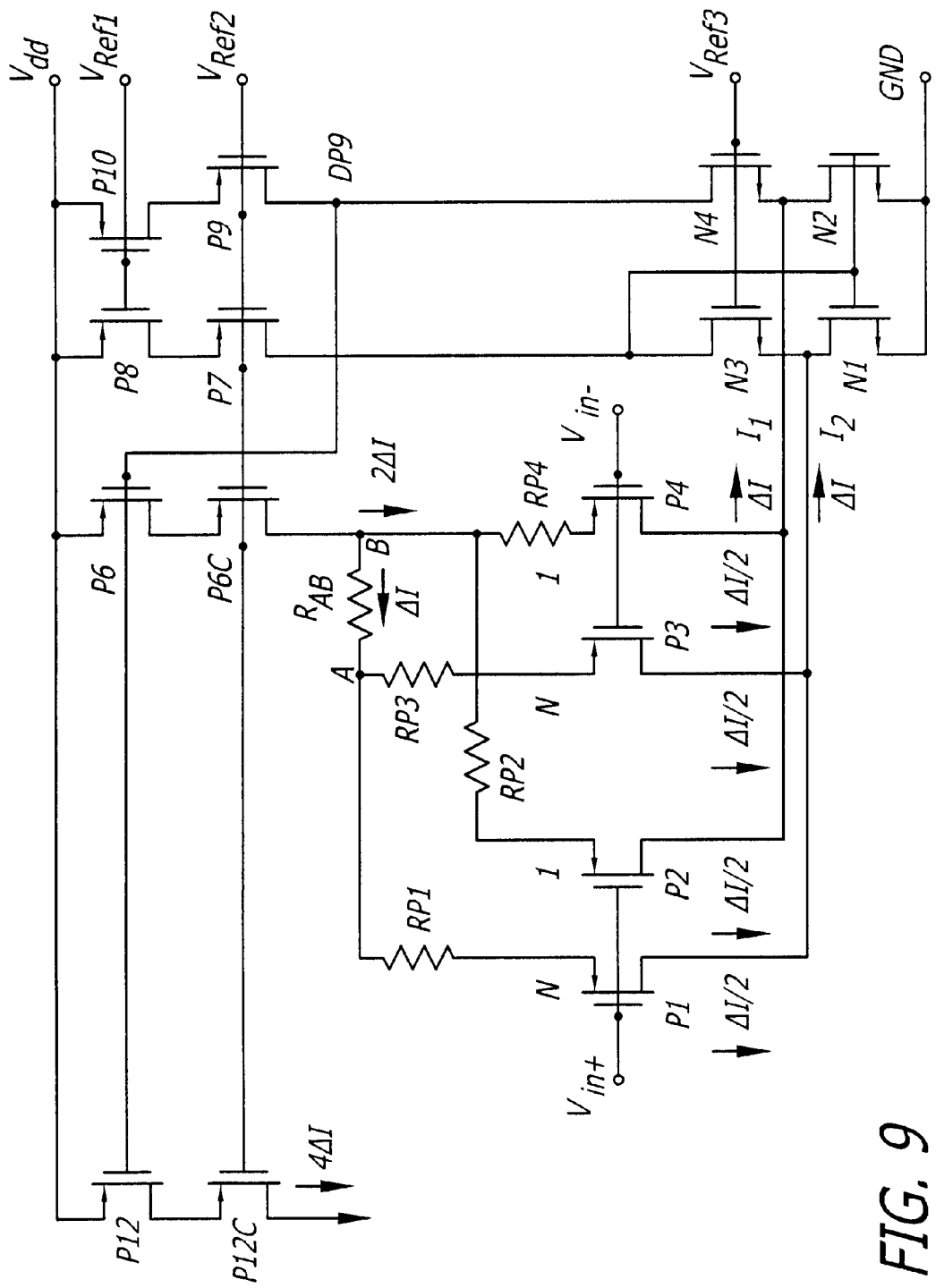
FIG. 9 is a detailed circuit diagram of a differential GM model in accordance with one embodiment of the present invention.

FIG. 9 is a detailed circuit diagram of a differential GM model in accordance with one embodiment of the present invention. As can be seen, this circuit uses the constant GM concept differentially. The purpose of this circuit is to remove the dependency of GM on the differential body voltage $V_{bd}$, the input differential voltage $V_{id}$ and the input common mode voltage $V_{icm}$. The differential body voltage $V_{bd}$ dependency is the easiest to remove, namely by isolating each of the devices of the differential pairs of the GM blocks and the GM models on the integrated circuit and connecting the bodies of the transistors to their respective sources.

In the circuit of FIG. 9, $V_{ref1}$ sets the gate-source voltage of transistors P1 and P8, typically by mirroring a current from another p-type device, so that transistors P1 and P8 act as equal current sources. Transistors P9, P7, P6C and P12 have their gates coupled to a reference voltage $V_{ref2}$, which fixes the drain voltages of transistors P10, P8, P6 and P12 at one threshold above the reference voltage $V_{ref2}$. Similarly, transistors N3 and N4 have their gates coupled to a reference voltage $V_{ref3}$, which fixes the drain voltages of transistors N1 and N2 at one threshold below the reference voltage $V_{ref3}$. This substantially equalizes the drain voltages of transistors P10, P8, P6 and P12, and the drain voltages of transistors N1 and N2, so that the operating parameters of the transistors in each of these transistor groups will match very well.

Transistors P1, P8, N1 and N2 act as a loop amplifier. In particular, the current through transistor P8 plus the current $I_2$ is mirrored by transistor N1 to transistor N2. Consequently the current through transistor N4 will be equal to the current through transistor P8 plus the current $I_2$ minus the current $I_1$. Since the current through transistor P1 is equal to the current through transistor P8, the voltage on node DP9, which controls the gate-source voltage of, and thus the current through transistor P6 to provide the tail current to the input core of the GM model, will settle at a level setting $I_1 = I_2$.

Thus the currents $I_1$ and $I_2$ out of the input core toward the summing nodes at the drains of transistors N1 and N2 are always equal, regardless of the signal applied. This forces the following:

$$Ip1 + Ip3 = Ip2 + Ip4$$

Also, at $$Vdif = (Vin+) - (Vin-) = 0:$$

$$Ip2 = Ip4 \text{ and } Ip1 = Ip3$$

This forces all the currents through all transistors P1 through P4 to be equal at equilibrium (Vdif=0). The amount of these equal currents, each equal to ½ of the current through the resistor $R_{AB}$, can be found by analyzing a translinear loop containing one of the single constant GM cells. For the weak inversion, for example, it would be:

$$Ip1 = Ip2 = Ip3 = Ip4 = (\eta)(V_t) ln(N))/R_{AB}$$

Where:

η is a process dependant factor $V_t = kT/q$ k=Boltzmann's constant q=electron charge T=absolute temperature n=structure factor Note however, that while the currents in transistors P1 through P4 are all equal at equilibrium (Vdif=0), the current densities are not. Because MOS transistors P1 and P3 are N times the size of transistors P2 and P4, the current densities in transistors P2 and P4 is N times that in transistors P1 and P3.

Referring again to FIG. 9, assume that a positive differential input voltage is applied to the circuit (no change in the common mode input voltage). Vin− is reduced and the input voltage Vin+ is increased. In this case, the currents through transistors P1 and P2 will decrease and the currents through transistors P3 and P4 will increase. For a small differential input, the reduction in the current in P1 will equal the increase in the current in P3, the reduction in the current in P2 will equal the increase in the current in P4. Nodes A and B will not change voltage, and the current through transistor P6 will not change.

Figure 5A:
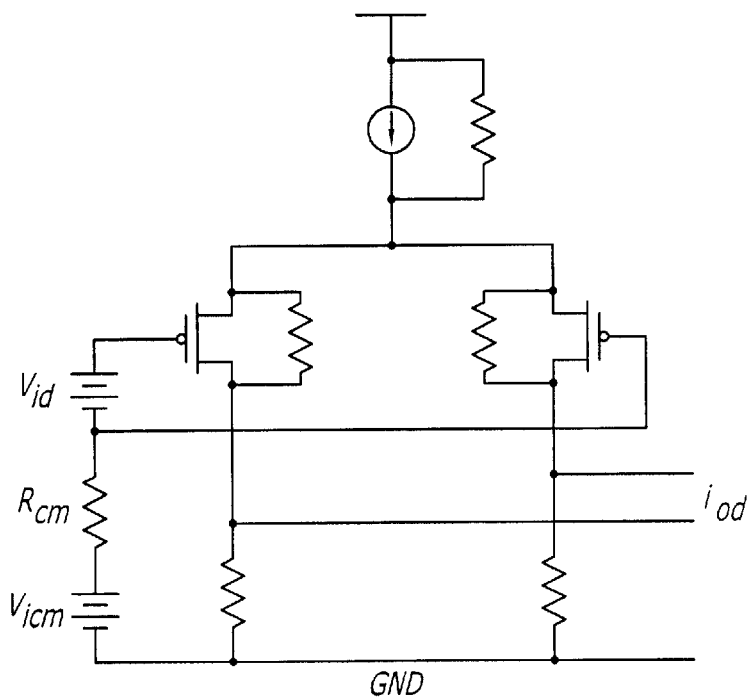
FIG. 5a is a differential pair model for determining the effects of finite intrinsic gain and mismatch on common mode rejection ratio.
Figure 5B:
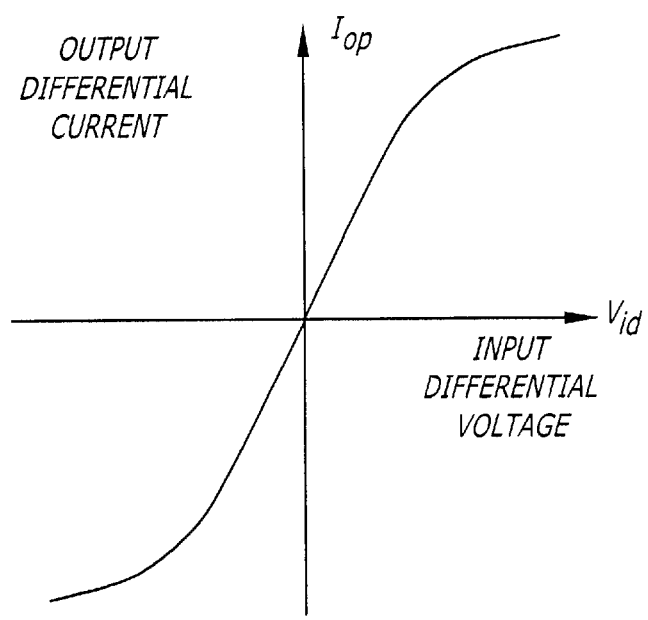
FIG. 5b is a curve illustrating the nonlinearity of the output differential current with input differential voltage for a MOS differential pair.

However as the differential input increases, transistors P2 and P4, operating at higher current densities than transistors P1 and P3, begin to exhibit a lower increase in output differential current than transistors P1 and P3 (see for instance, FIG. 5b, which reflects the effect of increased current densities). Now current $I_2$ is larger than current $I_1$. This lowers the voltage on the node DP9, providing more current through transistor P6. This in turn increases the voltage on node B, increasing the gate source voltage on transistors P2 and P4. It also increases the gate-source voltage on transistors P1 and P3, though attenuated by the increased current in, and thus voltage drop across resistor $R_{AB}$. Thus the voltage increase on node B will be less than that on node A. The circuit will settle again with $I_1 = I_2$. The net effect has been to increase the tail current for transistors P1 through P4, and thus the current through mirror transistors P12 and P12C providing the tail current to the respective amplifier GM1 and GM2 responsive to higher differential inputs. This compensates for the droop in GM of a differential pair at higher differential inputs. The amount of the compensation depends on the various parameters of the circuit, including particularly the parameters N and $R_{AB}$. N may be chosen as desired, though typically will be less than 10, and more preferably on the order of 4, as desired.

Now suppose the Vin− is kept constant and Vin+ is rising in voltage. In this case, obviously the currents through transistors P1 and P2 will decrease and those of transistors P3 and P4 will increase. Since transistor P1 is N× and transistor P2 is 1× in size, the amount of decrease in currents for transistors P1 and P2 are not equal. Transistor P1 will decrease more than transistor P2 in current, causing an extra current (automatically supplied by transistor P6 in the feedback loop) to compensate the amount of decrease of the GM due to the large differential swing at Vin+.

For the case when Vin+ is kept constant and Vin− swings high, a similar action will take place, but this time by transistors P3 and P4. Note the connection of transistors P1 and P3 to $R_{AB}$ is similar to the connection of transistors P3 and P4 to the very same resistor, i.e., an increase in Vin− will again cause the same increase in the current through transistor P6 to compensate for the GM loss at high input voltage swings.

By this, the dependency of GM on large swings is almost completely removed. In particular, it may be seen from the foregoing that the increase in the tail current provided by transistor P6 at higher differential inputs compensates for the reduction in GM of transistors P2 and P4 in the GM model, and is mirrored by transistor P12 to provide the compensated tail current to a MOS differential pair in a respective transconductance amplifier GM1 or GM2 coupled to the same input. Thus, the transistors of the differential MOS pair in a transconductance amplifier GM1 or GM2 should have substantially the same current density as the transistors P2 and P4 of the respective GM model, with transistors P1 and P3 having substantially lower current densities. This way, the increasing tail current provided by the respective transconductance model at higher differential inputs will match the need for increasing tail current for the differential pair in the corresponding differential amplifier to maintain a constant GM for the amplifier also. When the common mode voltage is changed, again similar to the circuit of the single constant GM model, the tail current source of P6 will change accordingly to adjust the GM to its constant value.

Note further, that the differential constant transconductance models are symmetrical about their inputs. Thus $V_{IN+}$ and $V_{IN-}$ on each GM model may be reversed without consequence, provided that negative feedback is maintained in FIG. 7. In the instrumentation amplifier, each differential amplifier and its respective GM model are matched. However, while it is convenient, it is not necessary for the second differential amplifier and its GM model to be a replica of the first, so long as they too match.

In summary, the advantages of this constant transconductance model include:

1. An increase in gain accuracy through better match of GM1=GM2 α 1/$R_{AB}$ as the total closed loop gain of the instrumentation amplifier is equal to Gain=(GM1/GM2)(1+R2/R1)

2. Better linearity as the large signal swings increase the tail currents of the input/output GM blocks to increase the linear range of the amplifier, especially at extreme ends (without the GM models, the I–V characteristics of the differential pairs would flatten faster). Also a better gain linearity is achieved as the GMs track better 3. An increase in CMRR due to the negative feedback loop containing P6 by keeping the tail current source regulated in such a way that the GM is not much dependent on the common mode voltage.

In order to further enhance the CMRR of the circuit, a cascoding of high and low threshold MOS devices has been performed. Each MOS transistor in the input/output GM pairs (GM1 and GM2) and also in the bias and GM model circuitry itself has been replaced with the configuration shown in FIG. 10, with degeneration resistors RP1, RP2, RP3, RP4 at the sources of high threshold transistors P1, P2, P3, P4. Similar degeneration resistors are also used in the GM1 and GM2 themselves.

Figure 11:
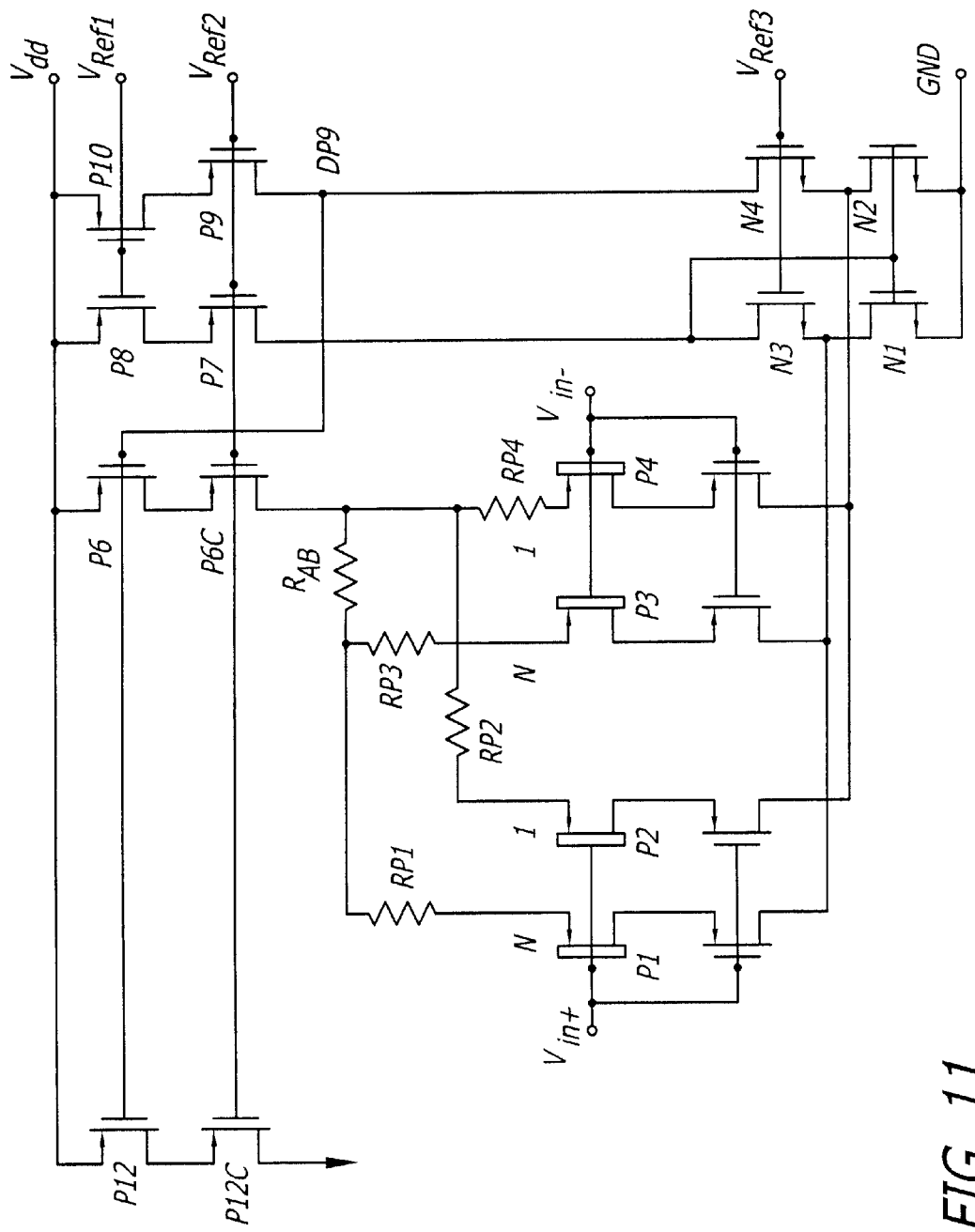
FIG. 11 is a circuit diagram for a preferred differential GM model with cascading.

The result is a further improvement in CMRR of the final instrumentation amplifier. Simulation has indicated typical values in the order of +130 dB of CMRR, even for a gain as low as unity. The preferred GM model with cascading is shown in FIG. 11, and the preferred GM block for each of the input and output GM pairs (GM1 and GM2 of FIG. 7) is shown in FIG. 12. Cascoding may also be used in the single GM model of FIG. 8, single GM models also being useable in the instrumentation amplifiers of the present invention. As a further alternate, cascading of transistors other than transistors P6 and P12 may be used to increase headroom in the circuit using the output current of the GM model, single or differential.

While certain preferred embodiments of the present invention have been disclosed herein, such disclosure is only for purposes of understanding exemplary embodiments and not by way of limitation of the invention. It will be obvious to those skilled in the art that various changes in form and detail may be made in the invention without departing from the spirit and scope of the invention as set out in the full scope of the following claims.

What is claimed is:

1. A single constant GM model comprising:

first and second transistors, each having first and second terminals and a control terminal, the current though the first and second terminals of each transistor being responsive to the voltage between the respective control terminal and the first terminal, the first transistor being N times the size of the second transistor;

a resistor;

a first controllable current source;

a second current source; and, an amplifier having a differential input coupled to the second terminals of the first and second transistors and an output coupled to the first controllable current source;

the first controllable current source being coupled to the first terminal of the second transistor, and through the resistor to the first terminal of the first transistor;

the control terminals of the first and second transistors being coupled to a common mode input;

the amplifier amplifying the difference in current from the second terminals of the first and second transistors to control the first controllable current source;

the first controllable current source being coupled to the second current source to mirror the current of the first controllable current source to the second current source to provide a constant GM model output current.

2. A single constant GM model comprising:

first and second transistors, each having first and second terminals and a control terminal, the current though the first and second terminals of each transistor being responsive to the voltage between the respective control terminal and the first terminal, the first transistor being N times the size of the second transistor;

a resistor;

a first controllable current source;

a second current source; and, an amplifier having a differential input coupled to the second terminals of the first and second transistors and an output coupled to the first controllable current source;

the first controllable current source being coupled to the first terminal of the second transistor, and through the resistor to the first terminal of the first transistor;

the control terminals of the first and second transistors being coupled to a differential input;

the amplifier amplifying the difference in current from the second terminals of the first and second transistors to control the first controllable current source;

the first controllable current source being coupled to the second current source to mirror the current of the first controllable current source to the second current source to provide a constant GM model output current.

3. A differential constant GM model comprising:

first, second, third and fourth transistors, each having first and second terminals and a control terminal, the current though the first and second terminals of each transistor being responsive to the voltage between the respective control terminal and the first terminal, the first and third transistors being N times the size of the second and fourth transistors;

a first resistor;

a first controllable current source;

a second current source; and, a feedback differential amplifier having first and second inputs, the first input being coupled to the second terminals of the first and third transistors, the second input being coupled to the second terminals of the second and fourth transistors, the amplifier having an output coupled to the first controllable current source;

the first controllable current source being coupled to the first terminals of the second and fourth transistors, and through the first resistor to the first terminals of the first and third transistors;

the control terminals of the first and second transistors being coupled to one input of the differential constant GM model, and the control terminals of the third and fourth transistors being coupled to another input of the differential constant GM model;

the amplifier amplifying the difference in current from the second terminals of the first and third transistors, and the second and fourth transistors, to control the first controllable current source;

the first controllable current source being coupled to the second current source to mirror the current of the first controllable current source to the second current source to provide a differential constant GM model output current.

4. The differential constant GM model of claim 3 further comprising second through fifth resistors, the first controllable current source being coupled to the first terminals of the second and fourth transistors through the third and fifth resistors, respectively, and through the first resistor to the first terminals of the first and third transistors through the second and fourth resistors, respectively.

5. The differential constant GM model of claim 3 wherein the first controllable current source and the second current source comprise fifth and sixth transistors, respectively.

6. An instrumentation amplifier having an instrumentation amplifier differential input and an instrumentation amplifier output comprising:

first and second MOS amplifiers having differential inputs;

first and second differential transconductance models, each having two MOS differential pairs coupled to a differential input to provide a tail current to operate a MOS differential pair over a range of common mode and differential inputs at a fixed transconductance;

an output amplifier;

the instrumentation amplifier differential input being coupled to the differential input of the first MOS amplifier and the differential input of the first differential transconductance model;

the differential input of the second MOS amplifier and the differential input of the second differential transconductance model being coupled to the instrumentation amplifier output;

the first and second differential transconductance models being coupled to provide tail currents to the first and second MOS amplifiers, respectively;

the output amplifier being coupled to provide an instrumentation amplifier output responsive to the difference in outputs of the first and second MOS differential amplifiers;

each differential transconductance model comprising:

first, second, third and fourth transistors, each having first and second terminals and a control terminal, the current though the first and second terminals of each transistor being responsive to the voltage between the respective control terminal and the first terminal, the first and third transistors being N times the size of the second and fourth transistors;

a first resistor;

a first controllable current source; and, a feedback differential amplifier having first and second inputs, the first input being coupled to the second terminals of the first and third transistors, the second input being coupled to the second terminals of the second and fourth transistors, the amplifier having an output coupled to the first controllable current source;

the first controllable current source being coupled to the first terminals of the second and fourth transistors, and through the first resistor to the first terminals of the first and third transistors;

the control terminals of the first and second transistors being coupled to the one differential input of the differential transconductance model, and the control terminals of the third and fourth transistors being coupled to the other input of the differential transconductance model;

the amplifier amplifying the difference in current from the second terminals of the first and third transistors, and the second and fourth transistors, to control the controllable current source;

the first controllable current source being coupled to the second current source to mirror the current of the first controllable current source to the second current source to provide a differential constant GM model output current;

each differential constant GM model output current being coupled to provide the tail current for the respective first and second differential amplifiers.

7. The instrumentation amplifier of claim 6 wherein each differential constant GM model is further comprised of second through fifth resistors, the first controllable current source being coupled to the first terminals of the second and fourth transistors through the third and fifth resistors, respectively, and through the first resistor to the first terminals of the first and third transistors through the second and fourth resistors, respectively.

8. An instrumentation amplifier having an instrumentation amplifier differential input and an instrumentation amplifier output comprising:

first and second MOS amplifiers having differential inputs;

first and second single transconductance models, each having a MOS differential pair coupled to a differential input to provide a tail current to operate a MOS differential pair over a range of common mode and differential inputs at a fixed transconductance;

an output amplifier;

the instrumentation amplifier differential input being coupled to the differential input of the first MOS amplifier and the differential input of the first single transconductance model;

the differential input of the second MOS amplifier and the differential input of the second single transconductance model being coupled to the instrumentation amplifier output;

the first and second single transconductance models being coupled to provide tail currents to the first and second MOS amplifiers, respectively;

the output amplifier being coupled to provide an instrumentation amplifier output responsive to the difference in outputs of the first and second MOS differential amplifiers;

each single transconductance model comprises:

first and second transistors, each having first and second terminals and a control terminal, the current though the first and second terminals of each transistor being responsive to the voltage between the respective control terminal and the first terminal, the first transistor being N times the size of the second transistor;

a first resistor;

a first controllable current source;

a second current source; and, an amplifier having a differential input coupled to the second terminals of the first and second transistors and an output coupled to the first controllable current source;

the first controllable current source being coupled to the first terminal of the second transistor, and through the first resistor to the first terminal of the first transistor;

the control terminals of the first and second transistors being coupled to the differential input of the respective single transconductance model;

the amplifier amplifying the difference in current from the second terminals of the first and second transistors to control the first controllable current source;

the first controllable current source being coupled to the second current source to mirror the current of the first controllable current source to the second current source to provide a constant GM model output current;

each differential constant GM model output current being coupled to provide the tail current for the respective first and second differential amplifiers.

* * * * *